(12) United States Patent
Lindeboom et al.

(10) Patent No.: US 7,427,571 B2
(45) Date of Patent: Sep. 23, 2008

(54) REACTOR DESIGN FOR REDUCED PARTICULATE GENERATION

(75) Inventors: Bartholomeus Hans Louis Lindeboom, Bilthoven (NL); Gert-Jan Snijders, Amersfoort (NL)

(73) Assignee: ASM International, N.V., Bilthoven (NL)

( * ) Notice: Subject to any disclaimer, the term of this patent is extended or adjusted under 35 U.S.C. 154(b) by 363 days.

(21) Appl. No.: 11/251,546

(22) Filed: Oct. 14, 2005

(65) Prior Publication Data
US 2006/0105107 A1  May 18, 2006

Related U.S. Application Data

(60) Provisional application No. 60/619,108, filed on Oct. 15, 2004.

(51) Int. Cl.
*H01L 21/31* (2006.01)
(52) U.S. Cl. .............................. 438/758; 257/E21.077; 257/E21.516
(58) Field of Classification Search ................ 438/758; 257/E21.077, E21.516
See application file for complete search history.

(56) References Cited

U.S. PATENT DOCUMENTS

| | | | |
|---|---|---|---|
| 4,262,631 A | 4/1981 | Kubacki | |
| 4,277,320 A | 7/1981 | Beguwala et al. | |
| 4,298,629 A | 11/1981 | Nozaki et al. | |
| 4,363,828 A | 12/1982 | Brodsky et al. | |
| 4,389,973 A | 6/1983 | Suntola et al. | |

(Continued)

FOREIGN PATENT DOCUMENTS

EP     0442490 A1    8/1991

(Continued)

OTHER PUBLICATIONS

Hiltunen et al., "Nitrides of Titanium, Niobium, Tantalum and Molybdenum Grown as Thin Films by the Atomic Layer Epitaxy Method," Thin Solid Films, 166 (1988) 149-154.

(Continued)

*Primary Examiner*—Scott B. Geyer
*Assistant Examiner*—Seahvosh J Nikmanesh
(74) *Attorney, Agent, or Firm*—Knobbe Martens Olson & Bear LLP

(57) ABSTRACT

Particle formation in semiconductor fabrication process chambers is reduced by preventing condensation on the door plates that seal off the process chambers. Particles can be formed in a process chamber when reactant gases condense on the relatively cool surfaces of a door plate. This particle formation is minimized by heating the door plate to a temperature high enough to prevent condensation before flowing reactant gases into the process chamber. The door plate can be heated using a heat source, e.g., a resistive heater, that is in direct contact with the door plate or the heat source can heat the door plate from a distance by radiative or inductive heating. In addition, the door plate can open to allow loading and unloading of a wafer load. As it passes flanges near the door plate, the wafer load can transfer heat to those flanges. To prevent overheating, the flange is provided with a coolant-containing channel having walls that are spaced from the flange by O-rings. The spacing of the channel walls to the flange can be varied to vary the amount of thermal contact and cooling achieved using the channels.

22 Claims, 2 Drawing Sheets

U.S. PATENT DOCUMENTS

| | | | |
|---|---|---|---|
| 4,495,218 A | | 1/1985 | Azuma et al. |
| 4,557,950 A | * | 12/1985 | Foster et al. ................. 438/774 |
| 4,570,328 A | | 2/1986 | Price et al. |
| 4,585,671 A | | 4/1986 | Kitagawa et al. |
| 4,684,542 A | | 8/1987 | Jasinski et al. |
| 4,699,805 A | | 10/1987 | Seelbach et al. |
| 4,715,937 A | | 12/1987 | Moslehi et al. |
| 4,834,020 A | | 5/1989 | Bartholomew |
| 4,851,095 A | | 7/1989 | Scobey et al. |
| 4,935,661 A | | 6/1990 | Heinecke et al. |
| 5,227,329 A | | 7/1993 | Kobayashi et al. |
| 5,356,673 A | | 10/1994 | Schmitt et al. |
| 5,389,398 A | | 2/1995 | Suzuki et al. |
| 5,389,570 A | | 2/1995 | Shiozawa |
| 5,453,858 A | | 9/1995 | Yamazaki |
| 5,607,724 A | | 3/1997 | Beinglass et al. |
| 5,614,257 A | | 3/1997 | Beinglass et al. |
| 5,648,293 A | | 7/1997 | Hayama et al. |
| 5,656,531 A | | 8/1997 | Thakur et al. |
| 5,695,819 A | | 12/1997 | Beinglass et al. |
| 5,698,771 A | | 12/1997 | Shields et al. |
| 5,700,520 A | | 12/1997 | Beinglass et al. |
| 5,769,950 A | | 6/1998 | Takasu et al. |
| 5,786,027 A | | 7/1998 | Rolfson |
| 5,789,030 A | | 8/1998 | Rolfson |
| 5,837,580 A | | 11/1998 | Thakur et al. |
| 5,874,129 A | | 2/1999 | Beinglass et al. |
| 5,876,797 A | | 3/1999 | Beinglass et al. |
| 5,885,869 A | | 3/1999 | Turner et al. |
| 5,907,792 A | | 5/1999 | Droopad et al. |
| 5,916,365 A | | 6/1999 | Sherman |
| 5,968,593 A | * | 10/1999 | Sakamoto et al. ........ 427/248.1 |
| 6,015,590 A | | 1/2000 | Suntola et al. |
| 6,027,705 A | | 2/2000 | Kitsuno et al. |
| 6,083,810 A | | 7/2000 | Obeng et al. |
| 6,136,654 A | | 10/2000 | Kraft et al. |
| 6,159,828 A | | 12/2000 | Ping et al. |
| 6,171,662 B1 | | 1/2001 | Nakao |
| 6,197,669 B1 | | 3/2001 | Twu et al. |
| 6,197,694 B1 | | 3/2001 | Beinglass |
| 6,200,893 B1 | | 3/2001 | Sneh |
| 6,203,613 B1 | | 3/2001 | Gates et al. |
| 6,228,181 B1 | | 5/2001 | Yamamoto et al. |
| 6,326,311 B1 | | 12/2001 | Ueda et al. |
| 6,390,753 B1 | | 5/2002 | De Ridder |
| 6,391,803 B1 | | 5/2002 | Kim et al. |
| 6,455,892 B1 | | 9/2002 | Okuno et al. |
| 6,468,924 B2 | | 10/2002 | Lee et al. |
| 6,506,691 B2 | * | 1/2003 | Cook et al. ................. 438/791 |
| 6,528,530 B2 | | 3/2003 | Zeitlin et al. |
| 6,537,910 B1 | | 3/2003 | Burke et al. |
| 6,613,695 B2 | | 9/2003 | Pomarede et al. |
| 6,638,879 B2 | | 10/2003 | Hsich et al. |
| 6,663,332 B1 | | 12/2003 | Sluijk et al. |
| 2001/0014267 A1 | * | 8/2001 | Yamaga et al. .............. 414/217 |
| 2002/0098627 A1 | | 7/2002 | Pomarede et al. |
| 2002/0168868 A1 | | 11/2002 | Todd |
| 2002/0197831 A1 | | 12/2002 | Todd et al. |
| 2003/0022528 A1 | | 1/2003 | Todd |
| 2003/0049372 A1 | * | 3/2003 | Cook et al. .............. 427/248.1 |
| 2003/0082300 A1 | | 5/2003 | Todd et al. |
| 2003/0111013 A1 | | 6/2003 | Oosteriaken et al. |
| 2003/0148605 A1 | | 8/2003 | Shimogaki et al. |

FOREIGN PATENT DOCUMENTS

| | | |
|---|---|---|
| EP | 0526779 A1 | 2/1993 |
| JP | 59078919 A | 1/1982 |
| JP | 57209810 A | 12/1982 |
| JP | 59078918 A | 5/1984 |
| JP | 60043485 A | 3/1985 |
| JP | S60-43485 | 3/1985 |
| JP | 61153277 A | 7/1986 |
| JP | 62076612 A | 4/1987 |
| JP | 63003414 A | 1/1988 |
| JP | 63003463 A | 1/1988 |
| JP | 01217956 A | 8/1989 |
| JP | 01268064 A | 10/1989 |
| JP | 02155225 A | 6/1990 |
| JP | H 02-155225 | 6/1990 |
| JP | 03091239 A | 4/1991 |
| JP | H3-91239 | 4/1991 |
| JP | 03185817 A | 8/1991 |
| JP | 03187215 A | 8/1991 |
| JP | H3-185817 | 8/1991 |
| JP | H3-187215 | 8/1991 |
| JP | 03292741 A | 12/1991 |
| JP | 04323834 A | 11/1992 |
| JP | 05021378 A | 1/1993 |
| JP | 05062911 A | 3/1993 |
| JP | H5-62911 | 3/1993 |
| JP | 07249618 A | 9/1995 |
| JP | 08242006 A | 9/1996 |
| WO | WO 2004/008491 | 1/2004 |

OTHER PUBLICATIONS

Hillman et al., "Properties of LPCVD TiN Barrier Layers," Microelectronic Engineering 19 (1992) 375-378.

Hiramatsu et al., Formation of TiN Films with Low Cl Concentration by Pulsed Plasma Chemical Vapor Deposition, J. Vac. Sci, Technol A, 14(3) May/Jun. 1996.

Ikoma et al., Growth of Si/3C-SiC/Si(100) hetrostructures by pulsed supersonic free jets, Applied Physics Letters, vol. 75, No. 25, pp. 3977-3979, Dec. 1999.

Iyer, R. Suryanarayanan et al., "A Process Method of Silicon Nitride Atomic Layer Cyclic Deposition," Semicon Taiwan 2001, pp. 17-25.

Nakano et al., "Digital Chemical Vapor Deposition of $SiO_2$," Appl Phys. Lett. (11) Sep. 1990, pp. 1096-1098.

Ramanuja, et al., "Synthesis and characterization of low pressure chemically vapor deposited titanium nitride films using $TiCl_4$ and $NH_3$," Materials Letters 57 (2002) 261-269.

Sakaue et al., Digital Chemical Vapor Deposition of $SiO_2$ Using a Repetitive Reaction of Triethylsilane/Hydrogen and Oxidation, Japanese Journal of Applied Materials, vol. 30, No. 1B, Jan. 1990, pp. L 124-L 127.

* cited by examiner

REACTOR DESIGN FOR REDUCED PARTICULATE GENERATION

CROSS-REFERENCE TO RELATED APPLICATIONS

This application claims the priority benefit of U.S. Provisional Application No. 60/619,108, filed Oct. 15, 2004.

This application is also related to U.S. patent application Ser. No. 11/096,861, filed Mar. 31, 2005, the entire disclosure of which is incorporated herein by reference.

FIELD OF THE INVENTION

This invention relates to reactors for semiconductor substrate processing.

BACKGROUND OF THE INVENTION

Semiconductor substrates can be processed in batches in vertical furnaces. An example of such processing is the deposition of films of various materials on the substrates. For a variety of reasons, including uniformity of electrical and physical properties, high purity and uniformity is typically desired for the deposited films. Deposition results, however, can be adversely affected by the presence of particulate matter in the furnace. In some cases, the particles can come to rest on or be incorporated into the films, thus degrading the purity and uniformity of the deposited films.

Accordingly, to consistently achieve high quality process results, a need exists for processing methods and systems that can consistently achieve low particle levels.

SUMMARY OF THE INVENTION

According to one aspect of the invention, a method of depositing a film on a semiconductor wafer is provided. The method includes providing a hot wall vertical furnace, having a process chamber with an opening at its lower end. A wafer boat holding a plurality of wafers is loaded into the process chamber. The wafer boat is supported on a door plate. The door plate is sealed against a surface of the furnace to close the opening. Process gases are introduced into the process chamber only after the door plate has achieved a temperature of at least 100° C.

According to another aspect of the invention, a method of semiconductor processing is provided. A batch hot wall vertical reactor, having a process chamber with a closeable opening is provided. The reactor has a closure for sealing the opening. A wafer boat holding a plurality of substrates is loaded into the process chamber through the opening. The closure is heated and the temperature of the closure is monitored. A flow of process gases into the process chamber is started after the temperature of the closure is determined to be at a desired temperature or higher.

According to yet another aspect of the invention, a method of chemical vapor deposition is provided. A hot wall vertical furnace, having a process chamber with an opening, is provided. A wafer boat is loaded into the process chamber. The wafer boat is supported on a door plate configured to close the opening after the wafer boat is loaded. The inner surface of the door plate is contacted with only non-reactive gas after loading the wafer boat and until the door plate is above one or both of a reactant and chemical vapor deposition byproduct condensation temperature. Subsequently, reactant gases comprising ammonia and chlorine are fed into the process chamber.

According to another aspect of the invention, an apparatus is provided for vapor deposition on semiconductor substrates. The apparatus includes a vertical furnace process tube having an opening. The apparatus also includes a door plate configured to close the opening. An insulated pedestal is supported on the door plate and a wafer boat is supported on the pedestal. The wafer boat is dimensioned to fit within the process tube upon loading the wafer boat into the process tube through the opening and upon closing the opening. The apparatus also includes a heat source disposed below the insulated pedestal and configured to heat the door plate. A controller is configured to regulate reactant gas flow into the process tube.

According to yet another aspect of the invention, a metal nitride deposition reactor is provided. The reactor includes a vertical furnace process chamber having an opening at a lower end to allow loading and unloading of a wafer boat. A door plate is configured to support the wafer boat in the process chamber, and to seal the process chamber upon retention of the wafer boat in the process chamber. The reactor also comprises a door plate heating mechanism configured to heat the door plate to at least 100° C. Sources of ammonia-based and chloride-based reaction gases are in gas communication with the process chamber.

According to another aspect of the invention, a flange for a vertical semiconductor processing furnace is provided. The flange comprises walls defining a recess. A coolant enclosure is disposed within the recess. The enclosure has an interior channel extending along a length of the recess. Outer surfaces of the enclosure are spaced from the walls of the flange defining the recess. Spacers are positioned between the walls of the flange defining the recess and the outer surface of the enclosure. The spacers separate the walls of the flange defining the recess from the outer surface of the enclosure.

According to another aspect of the invention, a method of semiconductor processing is provided. The method comprises providing a reactor comprising a coolant enclosure. The enclosure comprises a channel and is disposed in a recess defined by surfaces of a reactor part. One or more spacers space the enclosure from the reactor part. The method further comprises cooling the reactor part by flowing a coolant through the channel.

BRIEF DESCRIPTION OF THE DRAWINGS

The invention will be better understood from the detailed description of the preferred embodiments and from the appended drawings, which are meant to illustrate and not to limit the invention and wherein like numerals refer to like parts throughout.

DETAILED DESCRIPTION OF THE PREFERRED EMBODIMENT

Figure 1:
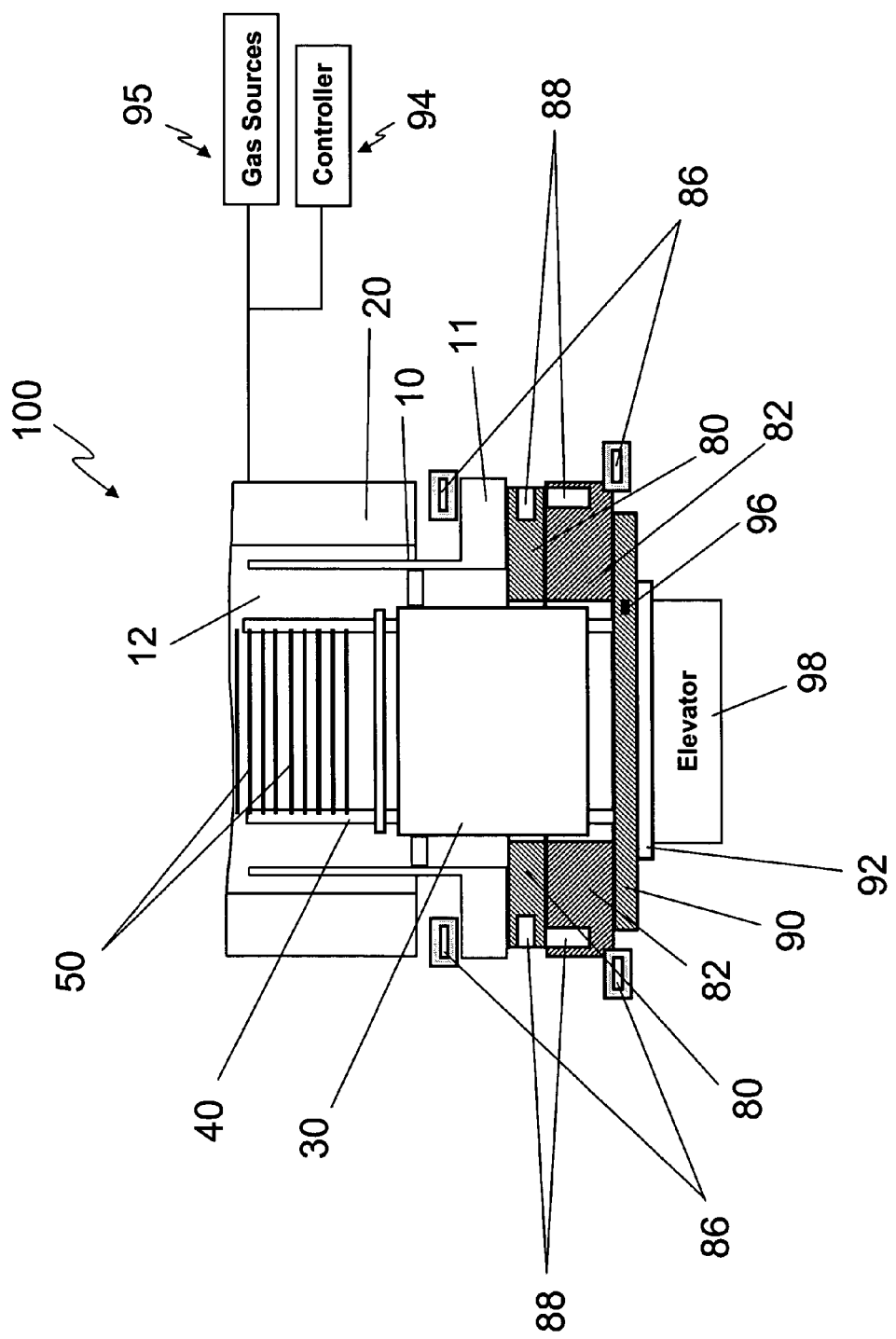
FIG. 1 is a schematic, cross-sectional view of the lower end of a vertical furnace, in accordance with preferred embodiments of the invention.

Co-pending and co-assigned U.S. patent application Ser. No. 11/096,861, filed Mar. 31, 2005, the entire disclosure of which is incorporated herein by reference, describes the deposition of titanium nitride films by flowing $TiCl_4$ and $NH_3$ as precursors into a furnace. Such a process has been found to be very sensitive to the occurrence of particles and can be prone to the formation of particles. For example, particles can result from the formation of reaction by-products, such as $NH_4Cl$, that condense on relatively cool furnace surfaces. These particles can then settle on the substrates being processed and can degrade process results.

To minimize condensation and, thus, minimize particle formation, U.S. patent application Ser. No. 11/096,861 discloses maintaining the flange of the process tube in the vertical furnace at an elevated temperature. In the exemplary reactor discussed in that patent application, the process tube delimits a reaction chamber for accommodating and processing the substrates. The flange at the bottom of the process tube forms a support surface for the process tube. A door plate, at the bottom of the furnace and sealing against the flange, opens to allow the substrates, typically situated on a wafer boat, to be elevated past the flange and loaded into the process tube. During unloading, the wafer boat can be lowered past the flange. The flange is provided with electrical heaters to maintain its temperature. It will be appreciated that a batch of substrates can be processed at a significantly higher temperature than the flange and the hot substrates can radiate heat and cause the flange to undesirably heat up when the batch is unloaded and moves pass the flange. To prevent overheating during wafer unloading, the flange is also provided with a water cooling system. While good particle performance was sometimes achieved with this reactor arrangement, the level of particles has been found to often exceed acceptable ranges.

It will be appreciated that, in general, chloride based chemistries using ammonia are susceptible to the formation of particles. Without being limited by theory, it is believed that the formation of particles is a result of condensation of reactants and/or reaction byproducts, e.g., $NH_4Cl$, on cold spots of the furnace, e.g., the flanges of a process tube in the furnace. Therefore, the flanges are preferably heated to temperatures high enough to prevent the condensation of $NH_4Cl$. The flanges are heated to a temperature of 100° C. or higher, more preferably 120° C. or higher, even more preferably 150° C. or higher and most preferably 180° C. or higher.

As noted above, in addition to being heated, the flanges are typically also cooled to, e.g., prevent heat damage to O-rings which may line the flanges. It will be appreciated that the O-rings are used to form a tight seal with other furnace surfaces, such as the door plate. While the cooling system preferably effectively prevents overheating of the substrate, it preferably does not cool the flange so greatly that the flange is cooled below the temperatures desired for preventing condensation.

In view of these conflicting requirements, preferred embodiments of the invention provide a cooling system which can effectively cool a flange or other furnace structure without overcooling. The flange is preferably provided with a fluid cooling system in which the fluid, preferably water, is flowed through an enclosure provided with channels containing the fluid. The enclosure is preferably disposed in a recess of the flange and is preferably distanced from the recess walls of the flange by spacers, which are the principal conduits for thermal transfer between the flange and the channels. The spacers can include, e.g., O-rings. By limiting thermal contact principally to the spacers, overcooling of the flange can be avoided, while adequate cooling can be facilitated by using an effective cooling medium, such as unheated water at or below room temperature. Advantageously, such a cooling system is particularly simple and also effective. The use of the spacers to regulate heat transfer has been found to be more reliable and simpler than using heated cooling media like warm or hot water or heated glycol, etc., to guard against overcooling of the flange and overheating of the cooling medium, which can eventually result in degradation or boiling of the cooling medium or can cause the formation of deposits in the channels through which the cooling medium circulates.

In addition to condensation on flanges, it has been found that significant condensation and particle formation can occur on the inside surfaces of furnace closures, such as door plates. Heat from the parts of the furnace above a door plate and from the heated flanges has typically been expected to heat the door plates, to prevent condensation on door plate surfaces. It has been found, however, that opening the door plate and moving it away from the furnace during wafer boat unloading can cool the door plate significantly. Thus, after the door plate is closed, there may be a period of time when the door plate is relatively cool. During this period, condensation on the door plate is possible. In addition, because the door plate preferably supports a wafer boat, there is a competing desire to minimize heating of the door plate, to prevent heat induced door plate deformation. As a result, furnaces often include thermal insulators between the wafer boat and door plate, to minimize heat conduction. This insulation prolongs the period when the door plate is relatively cool, leading to condensation in cases when the substrates are processed before the door plate is sufficiently hot to prevent condensation. In some cases, if the door plate is sufficiently well isolated and/or if the processing time is sufficiently short, the door plate may never reach a high enough temperature to prevent condensation.

To regulate the temperature of a door plate, preferred embodiments of the invention allow for changing heat flow to and from the door plate, either by active control or passively by design, to allow a desired door plate temperature to be achieved when the door plate is exposed to process gases. Preferably, the door plate is actively heated using a heat source, which allows the door plate to be heated independent of the heating of the wafer boat. In some embodiments, the heat source is a heater, e.g., a resistive heater, that is in direct contact with the door plate. In other embodiments, the heat source can be, e.g., a radiation source or an inductive heater that is not in physical contact with the door plate. Advantageously, the heat source can be used to heat the door plate, to ensure that the door plate is maintained at a desired temperature, to, e.g., prevent condensation on the door plate. Preferably, the temperature of the door plate is monitored and process gases are introduced only after the door plate has reached a desired temperature. A temperature sensor connected to a controller can be used to regulate the temperature of the door plate and the introduction of process gases. Because door plate heating no longer depends upon heat conduction from wafer boats and flanges, the door plate can be provided at the appropriate temperature to prevent condensation quickly after a wafer boat is loaded into a reaction chamber.

Reference will now be made to the Figures, wherein like numerals refer to like parts throughout.

Figure 2:
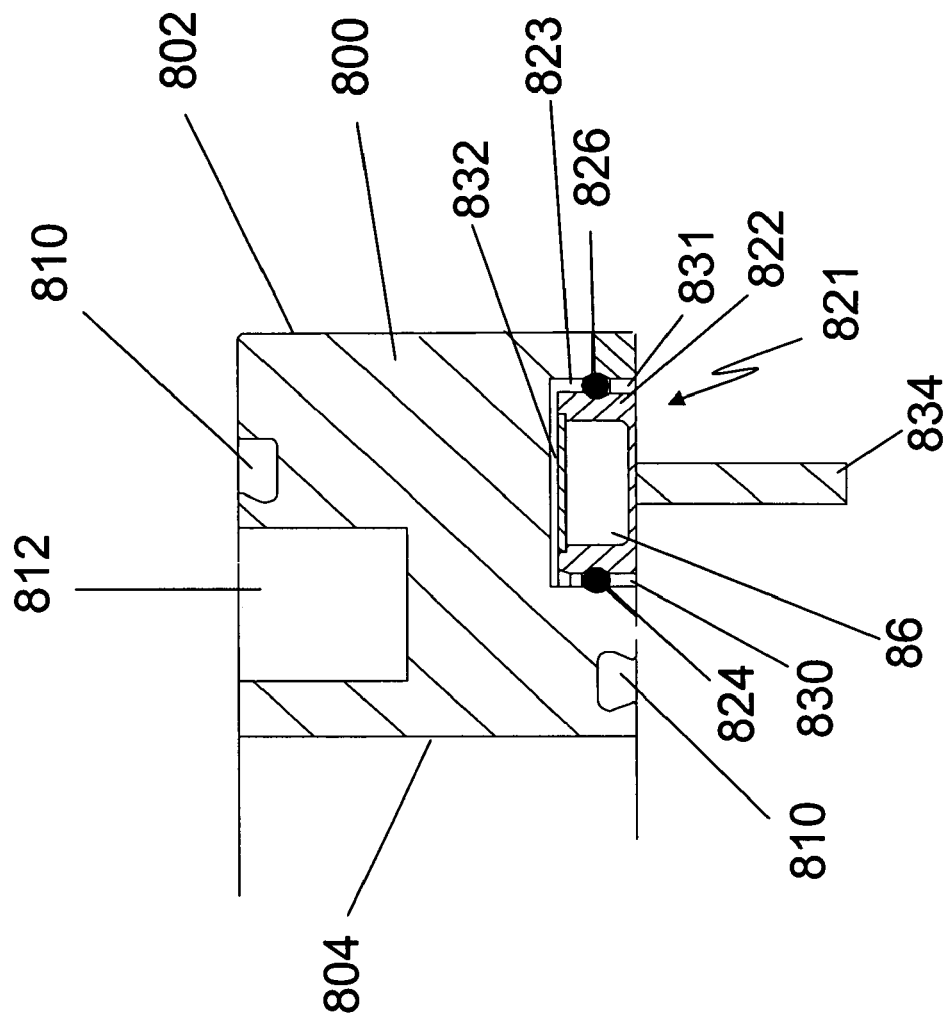
FIG. 2 is a detailed view of a water cooling channel in a flange of the vertical furnace of FIG. 1, in accordance with preferred embodiments of the invention.

FIGS. 1 and 2 illustrate an exemplary batch reactor, commercially available under the trade name A412™ from ASM International N.V. of Bilthoven, The Netherlands. The illustrated reactor is a vertical furnace type of reactor, which has benefits for efficient heating and loading sequences, but the skilled artisan will appreciate that the principles and advantages disclosed herein will also have application to other types of reactors.

FIG. 1 shows a cross-sectional side view of a lower section of a furnace 100. The furnace 100 comprises a process tube 10, which defines a process chamber 12. A heater 20 surrounds the process tube 10. A pedestal 30 supports a wafer boat 40, which holds a plurality of wafers 50, preferably 50 or more wafers. The pedestal 30 is preferably thermally insulating, to prevent undue heating of a door plate 90 supporting the pedestal 30. The process tube 10 (only the bottom end of which is shown) has a widened base 11 which is supported on annular flanges, including an upper flange 80 and a lower flange 82. The door plate 90 seals against the lower end of the lower flange 82 in the illustrated embodiment, when the door plate 90 is in a closed position. It will be appreciated that the door plate 90 can be formed of a single type of material, e.g., metal, or a combination of materials, e.g., metal and quartz. The door plate 90 is vertically movably and lifts to close the opening of the process tube 10 by sealing against the lower flange 82. The door plate 90 opens by moving downward relative to the lower flange 82. An upper surface of the door plate 90 supports the pedestal 30, which in turn supports the wafer boat 40. An elevator 98 can be provided to move, e.g., lift or lower, the door plate 90, pedestal 30 and wafer boat 40 to load or unload the wafer boat 40. Gases, including inert and reactive precursor gases, are provided to the process chamber 12 from gas sources 95, which can comprise a plurality of containers for holding various gases. In preferred embodiments, the precursor gases can include ammonia and chloride-containing gases, such as $TiCl_4$ and $NH_3$. The flow of gases from the gas sources 95 into the process chamber 12 is controlled by a controller 94.

The upper and lower flanges 80, 82 are provided with electrical heaters 88 to elevate the temperature of those flanges, to minimize condensation on the flanges. In an exemplary design for a furnace which processes 300 mm wafer, the flanges 80, 82 are provided with a total of 23 heaters, each heater providing a maximum of about 100 Watt of heat. It will be appreciated that the number of heaters depends upon the design of the flanges, the design and power of the heaters, the heat isolation of the pedestal 30 and on the amount of isolation material provided at the outside of the tube 10 and the flanges 80, 82. For example, more heaters would be employed if the flanges were larger in size, if the heaters were less powerful, if the pedestal 30 was highly insulating and, thus, minimized heat reaching the flanges 80, 82 from the upper parts of the furnace 100, and/or if the flanges 80, 82 lost significant amounts of heat do to minimal insulation of those flanges. Conversely, fewer heaters would be employed if the flanges were smaller in size, if the heaters were more powerful, if the pedestal 30 did not significantly thermally isolate the flanges 80, 82 from the upper parts of the furnace 100, and/or if the flanges 80, 82 were well insulated from heat loss.

As discussed above, during unloading of a processed wafer load, the hot wafers 50 and wafer boat 40 will pass the flanges 80, 82. Without precautions, O-rings in the flanges 80, 82, which contact other surfaces to provide a vacuum tight seal, would overheat. Deterioration of the O-rings would undesirably reduce the ability to isolate the atmosphere inside the process tube 10 from the ambient environment and could potentially result in contamination or otherwise adversely influence process results. Therefore, cooling channels 86 are provided to prevent overheating of the O-rings.

The channels 86 are preferably provided with a flowing fluid to remove heat from the flanges 80, 82, to cool the O-rings in contact with those flanges. A possible fluid for the channels 86 is water. However, water boils at 100° C. and has a large cooling capacity, which may cause the flange to be cooled too much. Advantageously, a particularly simple design according to some preferred embodiments avoids these and other disadvantages and allows the use of water cooling. As shown schematically in FIG. 1, the water cooling channels 86 are provided in non-intimate contact with the flanges 80, 82. The cooling channels are shown in more detail in FIG. 2.

With reference to FIG. 2, a flange 800 is shown with an outer surface 802 and an inner surface 804. It will be appreciated that the flange 800 can be, e.g., any of the structures 80 and/or 82 of FIG. 1. For example, where the flange 800 is the flange 82 of FIG. 1, a heater 812, corresponding to heaters 88 (FIG. 1), can be provided and O-rings can be provided in recesses 810 to allow the flange 82 to seal against neighboring structures.

With continued reference to FIG. 2, walls 822 of an enclosure 821 for holding coolant define a cooling channel 86. Preferably, the enclosure 821 extends continuously around the perimeter of the flange 800 and the channel 86 preferably also extends continuously around the perimeter of the flange 800 to facilitate even cooling of that flange. For example, in the illustrated embodiment, where the flange 800 is circular in a horizontal cross-section, the enclosure 821 is preferably in the shape of a ring. The annular ring 821 is preferably also removable to, e.g., facilitate furnace maintenance.

The ring 821 is preferably accommodated in a recess 823 in the flange 800. The recess 823 preferably extends completely around the flange 800 and the ring 821 preferably also extends along the length of the recess 823 to allow even cooling of the flange 800, as noted above. The recess 823 is larger than the ring 821. Thus, the recess has vertical inner walls spaced from the ring's vertical outer surfaces, so that gaps 830, 831 and 832 are present between the ring 821 and the flange 800. It will be appreciated that the gaps 801, 831 and 832 can be the same or different sizes. The ring 821 is preferably held in a fixed position in the recess 823 by O-rings 824 and 826. The O-rings serve as spacers and also allow thermal contact between the ring 821 and the flange 800. With this construction, contact is made over only a limited surface area. As a result, a cold cooling medium with a large cooling capacity, like cooling water, can be used without over cooling the flange 800, even where a relatively high flange temperature is required. Advantageously, preventing overcooling by this method is more reliable and simpler than using media with less cooling capacity, including heated cooling media like warm or hot water or heated glycol.

The arrangement shown in FIG. 2 allows tailoring of the thermal contact between flange 800 and ring 821 to accommodate different processing requirements. The gaps 830, 831 and 832 between the ring 821 and the flange 800 can be varied to vary the heat transfer between the ring 821 and the flange 800. For example, the size of the recess 823 can be increased or decreased, and/or the size of the ring 821 can be decreased or increased, to decrease or increase, respectively, the sizes of the gaps 830, 831 and 832 between the flange 800 and the ring 821.

In some embodiments, different rings 821, having different sizes and, hence, different size gaps 830, 831 and 832 in recess 823 can be applied. It will be appreciated that the larger the gaps 830, 831 and 832, the smaller the thermal contact.

The thermal contact can also be tailored by changing the shape of the O-rings 824 and 826, resulting in a different size of the contact area. It will be appreciated that a larger contact area results in greater thermal contact. Furthermore, the thermal conductivity of the O-rings used can be adjusted by changing the material of the O-rings, e.g., carbon filling of the O-rings results in a higher thermal conductivity.

In some arrangements, the position of the ring 821 can be adjusted by an actuator 834, thereby varying the thermal contact between the ring 821 and the flange 800. The actuator 834 can be formed as part of the ring 821, can be formed within the flange 800 or can be external to the both the ring 821 and flange 800, but preferably mechanically connected to the ring 821. Preferably, the actuator 834 is in communication with the controller 94. By adjusting the position of ring 821, the widths of the gaps 830, 831 and 832 can be changed, resulting in a changed thermal contact. For example, the position of the ring 821 can be changed to such an extent that a surface of the ring 821 is in direct contact with the interior surface of the recess 823, thereby allowing for maximum thermal contact. By varying the position of the ring 821, the thermal contact can be dynamically changed, so that during a first stage of a processing cycle the thermal contact between ring 821 and recess 823 has a first value and during a second stage of a processing cycle this thermal contact has a second value. For example, a high value thermal contact can be chosen when the flange is exposed to heat radiation of a hot wafer boat during unloading and a low value thermal contact can be chosen during other stages of the processing cycle. The position of ring 821 can even be continuously controlled based on a temperature measured in the door plate 92 (FIG. 1) or in flange 800, to continuously control the temperature of the flange 800.

Referring again to FIG. 1, as noted above, the door plate 90 is a more difficult object to control in temperature than the flanges 80, 82. With each unloading of the wafer boat 40 the door plate 90 moves away from the hot furnace 100 in a downward direction and cools down significantly. After loading a newly loaded boat 40 into the furnace 100 again, the door plate 90 will be heated with heat coming from the hot parts of the furnace above the door plate 90 and from from the heated flanges 80, 82. The isolating value of the pedestal 30 can be adjusted within certain limits to increase the heat reaching the door plate 90, to sufficiently heat the door plate 90 to prevent condensation. However, during long processes the pedestal 30 preferably has a high insulation value to sufficiently isolate the door plate 90, to prevent overheating of the door plate 90. These requirements of providing heat to quickly heat the door plate 90 and minimizing heat transfer to prevent door plate heating and deformation are conflicting. In many cases, it has been found that a sufficiently high door plate temperature to prevent $NH_4Cl$ or other reactant/byproduct condensation is not achieved or only achieved after excessively long heating times, which can adversely affect throughput.

With reference again to FIG. 1, in addition to or as an alternative to adjusting the isolation value of the pedestal 30 to supply sufficient heat to the door plate 90, a door plate heater 92 is preferably provided. The door plate heater 92 is preferably provided below the pedestal 30. As illustrated, the door plate heater 92 can be provided below the pedestal 30 and the door plate 90. In exemplary embodiments, the heater 92 preferably provides about 200-700 watts, more preferably about 500 watts of power. Heating of the door plate 90 for about 20-30 minutes is, in many cases, sufficient to achieve a temperature of about 100° C. or more or of about 120° C. or more. Preferably, to maximize processing throughput, the heating power of the heater 92 is chosen so as to heat the door plate 90 to a desired temperature quickly enough so that the furnace 100 does not remain idle after a wafer load is loaded into the furnace 100 and heated to a desired processing temperature. Advantageously, a door plate 90 heating duration of about 20-30 minutes is compatible with typical evacuation times and heating times for the wafer load in many vertical furnaces. In addition, to further decrease door plate heating times, the mass of the door plate 90 can be reduced so that its thermal capacity becomes smaller. However, the door plate preferably remains strong enough to withstand gas pressure from the ambient environment, e.g., atmospheric pressure, when the process chamber 12 is evacuated. The temperature to which the door plate 90 is heated is preferably chosen based upon the reactants used in a particular process; the temperature is preferably sufficiently high to prevent any undesired condensation on the door plate 90. For example, in some cases, for some chloride based chemistries using ammonia, the door plate 90 is heated to about 120° C. or higher, preferably about 150° C. or higher or about 180° C. or higher before contact with process gases. In the meantime, the process chamber 12 is preferably purged with an inert gas.

The temperature of the door plate 90 can be monitored in various ways. For example, a temperature sensor 96 is preferably provided to actively monitor and control the door plate temperature. Temperature sensor 96 is in communication with controller 94. After a desired door plate temperature is reached, the controller 94 causes reactant gases to flow from the gas source 95 into the process chamber 12 to perform various processes, including chemical vapor deposition of films on substrates.

In other embodiments, the temperature of the door plate 90 can be determined by calibration. For example, the temperature of the door plate 96, under a particular set of condition, e.g., using particular heaters with a particular level of power in a particular furnace, can be measured as a function of time. The amount of time needed to heat the door plates 90 to a desired temperature after loading a wafer boat 40 can be determined. In these embodiments, monitoring the temperature can simply include determining when a desired amount of time has elapsed, e.g., using a timer in the controller 94. After the desired amount of time has elapsed, the reactant gas can be flowed from the gas sources 95 into the process chamber 12.

Energy can be provided to the heater 92 in various ways. For example, in furnaces where the door plate 90 moves only up and down during loading and unloading, respectively, of a wafer load and where the heater 92 is a resistive heater, the resistive door plate heater 92 can be mounted on the door plate 90 and provided with flexible cables that allow the heater 92 to move up and down with the door plate 90. Alternatively, when the heater is mounted on the door plate 90, electrical contact is made via contacts provided on the elevator mechanism 98 which moves the door plate 90. In other embodiments, the heater can be formed inside the door plate 90, e.g., as resistive heating elements embedded inside the door plate.

In other cases, such as in the ASM International N.V. A412™ furnace design, the door plate 90 moves from a process position in the furnace to a cool-down position out of the furnace and then to an unloading position. Thus, the door plate 90 is not only vertically displaced but also horizontally displaced from the processing position, as described in U.S. Pat. Nos. 6,390,753 and 6,663,332,the entire disclosures of which are incorporated by reference herein. Accordingly, the heater 92 is preferably mounted on the elevator 98 that lifts the door plate 90 up and down. The heater 92 comes into thermal contact with the door plate 90 when the elevator 98 supports the door plate 90.

It will be appreciated that, in other embodiments, the heater can be a heat source that directs heat energy to the door plate and the heater and does not physically contact the door plate. For example, the heat source can be, e.g., a lamp or inductive heating device which provides heat energy to the door plate from a distance.

In addition, in some embodiments, heating of the door plate begins before the wafer boat is load into the process chamber or the door plate is continuously heated to maintain the door plate at a desired temperature. The heating can be variable, e.g., with a higher power initially to advantageously minimize heat up times or with a higher power during wafer boat unloading to counteract heat loss during the unloading, or can be at a relatively constant level. In other embodiments, door plate heating can be started after the wafer boat is loaded, e.g.., providing power to a resistive heater after wafer boat loading.

The preferred embodiments are particularly applicable to chemistries wherein a chlorine-containing reactant is used in combination with ammonia. Examples of chlorine-containing reactants are: $TiCl_4$, $SiCl_2H_2$, $HfCl_4$ and $AlCl_3$. Although the preferred embodiments are discussed in the context of a chlorine chemistry the principles described herein can advantageously be applied to other situations to avoid condensation of other condensable materials, such as in the case of organic reactant materials (e.g., alkoxymetals or alkoxy silanes).

Accordingly, it will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. A method of semiconductor processing, comprising:
   providing a batch reactor, comprising:
   a process chamber with a closeable opening;
   a flange;
   a closure for sealing against the flange to seal the opening;
   loading a wafer boat holding a plurality of substrates through the opening into the process chamber;
   sealing the closure against the flange;
   heating the closure;
   monitoring a temperature of the closure;
   starting a flow of process gases into the process chamber after the temperature of the closure is determined to be at a desired temperature or higher; and
   actively cooling the flange.

2. The method of claim 1, wherein monitoring the temperature comprises measuring the temperature of the closure with a temperature sensor attached to the closure.

3. The method of claim 1, when monitoring the temperature comprises timing a duration of heating the closure and ascertaining when a desired heating duration has elapsed, wherein the desired heating duration is an amount of time expected for the closure to reach the desired temperature or higher.

4. The method of claim 1, wherein heating the closure is performed for about 20-30 minutes before starting the flow of process gases.

5. The method of claim 4, wherein heating the closure comprises providing power to a resistive heater in thermal contact with the closure.

6. The method of claim 5, wherein providing power comprises providing 200-700 watts of power.

7. The method of claim 4, wherein heating the closure comprises radiatively heating the closure.

8. The method of claim 4, wherein heating the closure comprises inductively heating the closure.

9. The method of claim 1, wherein heating the closure is performed before and after loading the wafer boat.

10. The method of claim 1, wherein the desired temperature is sufficiently high to prevent condensation, on surfaces of the closure inside the process chamber, of the process gases and reaction byproduct of the process gases.

11. The method of claim 10, wherein the reaction byproduct is $NH_3Cl$.

12. The method of claim 10, wherein the desired temperature is at least 100° C.

13. The method of claim 12, wherein the desired temperature is at least 120° C.

14. The method of claim 13, wherein the desired temperature is at least 180° C.

15. The method of claim 1, further comprising flowing inert gas into the process chamber after loading the wafer boat and until starting the flow of process gases.

16. The method of claim 1, wherein the closure is a door plate.

17. The method of claim 16, wherein the door plate supports the wafer boat in the process chamber.

18. The method of claim 1, wherein the batch reactor is a vertical batch reactor.

19. The method of claim 18, wherein the opening is at a lower end of the batch reactor.

20. The method of claim 1, wherein actively cooling comprises flowing a coolant through a channel in a coolant enclosure in thermal contact with the flange.

21. The method of claim 1, wherein the reactor further comprises an O-ring in contact with the flange, wherein actively cooling maintains the flange below a temperature that causes heat damage to the O-ring.

22. The method of claim 21, wherein sealing the closure against the flange comprises forming a seal between the closure and the O-ring.

* * * * *